US 8,625,381 B2

(12) United States Patent
Lee

(10) Patent No.: US 8,625,381 B2
(45) Date of Patent: Jan. 7, 2014

(54) STACKED SEMICONDUCTOR DEVICE

(75) Inventor: Ho-Cheol Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 290 days.

(21) Appl. No.: 13/026,460

(22) Filed: Feb. 14, 2011

(65) Prior Publication Data

US 2011/0260331 A1    Oct. 27, 2011

(30) Foreign Application Priority Data

Apr. 26, 2010   (KR) .......................... 10-2010-0038583

(51) Int. Cl.
| | |
|---|---|
| G11C 5/06 | (2006.01) |
| G11C 5/02 | (2006.01) |
| H01L 23/02 | (2006.01) |
| H01L 23/48 | (2006.01) |
| H01L 23/52 | (2006.01) |
| H01L 29/40 | (2006.01) |
| H01L 21/00 | (2006.01) |
| G11C 8/02 | (2006.01) |
| G11C 8/12 | (2006.01) |
| G11C 8/10 | (2006.01) |

(52) U.S. Cl.
USPC ..... 365/230.03; 365/51; 365/72; 365/230.02; 365/63; 365/231; 365/230.06; 257/686; 257/777; 257/E21.614; 438/109

(58) Field of Classification Search
USPC ............. 365/51, 63, 72, 230.02, 230.03, 231, 365/230.06; 257/686, 777, E21.614; 438/109
See application file for complete search history.

(56) References Cited

U.S. PATENT DOCUMENTS

| | | | |
|---|---|---|---|
| 7,379,316 B2 | 5/2008 | Rajan | |
| 7,494,846 B2 | 2/2009 | Hsu et al. | |
| 7,633,785 B2 | 12/2009 | Kim et al. | |
| 2004/0257847 A1 | 12/2004 | Matsui et al. | |
| 2005/0099834 A1 | 5/2005 | Funaba et al. | |
| 2006/0262587 A1 | 11/2006 | Matsui et al. | |
| 2007/0064462 A1 | 3/2007 | Matsui | |
| 2008/0220565 A1* | 9/2008 | Hsu et al. | 438/109 |
| 2009/0015291 A1* | 1/2009 | Kim et al. | 326/52 |
| 2011/0079923 A1* | 4/2011 | Suh | 257/777 |

FOREIGN PATENT DOCUMENTS

| | | |
|---|---|---|
| JP | 08083217 A | 3/1996 |
| JP | 2000049277 A | 2/2000 |
| JP | 2001307057 A | 11/2001 |
| JP | 2004327474 A | 11/2004 |

(Continued)

*Primary Examiner* — J. H. Hur
(74) *Attorney, Agent, or Firm* — Volentine & Whitt, PLLC

(57) ABSTRACT

Provided is a stacked semiconductor device including n stacked chips. Each chip includes "j" corresponding upper and lower electrodes, wherein j is a minimal natural number greater than or equal to n/2, and an identification code generator including a single inverter connecting one of the j first upper electrode to a corresponding one of the j lower electrodes. The upper electrodes receive a previous identification code, rotate the previous identification code by a unit of 1 bit, and invert 1 bit of the rotated previous identification code to generate a current identification code. The current identification code is applied through the j lower electrodes and corresponding TSVs to communicate the current identification code to the upper adjacent chip.

18 Claims, 5 Drawing Sheets

(56) References Cited

FOREIGN PATENT DOCUMENTS

| KR | 1020010063182 A | 7/2001 |
| KR | 1020010098740 A | 11/2001 |
| KR | 1020020039012 A | 5/2002 |
| KR | 1020020039014 A | 5/2002 |
| KR | 1020020066095 A | 8/2002 |
| KR | 1020020076048 A | 10/2002 |
| KR | 1020030014100 A | 2/2003 |
| KR | 1020060030517 A | 4/2006 |
| KR | 100871381 B1 | 11/2008 |

* cited by examiner

STACKED SEMICONDUCTOR DEVICE

CROSS-REFERENCE TO RELATED APPLICATION

This application claims priority under 35 U.S.C. §119 to Korean Patent Application No. 10-2010-0038583 filed on Apr. 26, 2010, the subject matter of which is hereby incorporated by reference.

BACKGROUND

Embodiments of the inventive concept relate to stacked semiconductor devices and, more particularly, to stacked semiconductor devices capable of selecting between multiple, stacked chips.

The development of multifunctional, physically smaller electronic devices has motivated the development and design of highly integrated, multifunctional semiconductor devices. To facilitate high integration density and the multi-functionality of contemporary semiconductor devices, so-called "multi-chip packaging" (MCP) techniques have developed. MCP essentially allows a plurality of chips to be assembled and packaged into a single semiconductor device. MCP semiconductor devices may be divided into single-layer and multi-layered devices. Single-layer MCP semiconductor devices configure their constituent plurality of chips in a two dimensional (X and Y directions) arrangement. Multi-stage MCP semiconductor devices, also referred to as "stacked semiconductor devices" configured a plurality of chips in a three dimensional (X, Y and Z directions) arrangement. Within this description, the Z direction may be arbitrarily identified with a vertical stacking of the plurality of chips.

Certain conventional stacked semiconductor devices are configured to receive/provide input/output signals using interconnecting input/output (I/O) terminals. Wire bonding internal to the MCP may be used to connect I/O terminals of the plurality of stacked chips. Alternately, the I/O terminals for the plurality of chips may be connected using wire-bonding external to the MCP. However, the use of the wire-bonding increases inductance, so that the semiconductor device suffers from a decrease in performance an increase in size, and an increase in power consumption.

To make up for the above-described shortcomings, a wafer-level processed stack package (WSP) technique has been developed. In the WSP technique, circuits of the plurality of stacked chips are directly connected through via holes vertically penetrating each chip on a wafer level. These via holes may be formed using a laser, and may subsequently be filled with conductive material(s) to form so-called "through-silicon vias (TSVs)". Thus, since the stacked semiconductor devices using the WSP technique are configured to directly inter-connect the plurality of chips without the need for wires, it is possible to enhance the performance of the stacked semiconductor device. The vertical distance between the chips can also be reduced, so that it is possible to remarkably reduce the thickness of the stacked semiconductor device. In addition, it is possible to reduce a (X-Y) mounting area required for disposition of the stacked semiconductor device on a board or substrate. That is, the stacked semiconductor devices enjoy greatly enhanced integration density and improved performance with reduced power consumption.

However, since the plurality of chips forming a stacked semiconductor device are so-closely stacked and tightly inter-connected, it is very difficult to directly connect any given chip in the stacked plurality of chips to an external apparatus. Therefore, it is not easy to externally select a particular chip from the stacked plurality of chips. Thus, a method of more readily enabling the selection of each chip in a stacked plurality of chips is needed.

SUMMARY

Embodiments of the inventive concept provide a stacked semiconductor device configured to generate an identification code to select each of stacked multiple chips.

In one embodiment, the inventive concept provides a stacked semiconductor device comprising a stacked plurality of n chips. Each chip comprises; j first upper electrodes disposed in a first layer, wherein j is a minimal natural number greater than or equal to n/2, j lower electrodes disposed in a second layer on the first layer and being respectively associated with the j first upper electrodes, j first TSVs being respectively connected between the j lower electrodes and an upper adjacent chip in the stacked plurality of n chips, and an identification code generator including a single inverter connecting one of the j first upper electrode to a corresponding one of the j lower electrodes. The j first upper electrodes are configured to receive a previous identification code from a lower adjacent chip in the stacked plurality of n chips, rotate the previous identification code by a unit of 1 bit, and invert 1 bit of the rotated previous identification code to generate a current identification code, and the current identification code is applied through the j lower electrodes and j first TSVs to communicate the current identification code to the upper adjacent chip.

In one related aspect, the stacked semiconductor device may further comprises a printed circuit board (PCB) disposed below a lowest chip in the stacked plurality of n chips and configured to receive an externally provided j-bit identification code, wherein the j-bit identification code is the previous identification code received by the lowest chip.

In another aspect, each chip may further comprise; an identification code decoder configured to receive the current identification code from the identification code generator and decode the current identification code to generate an n-bit chip code, a chip selection code transmitter comprising a second upper electrode disposed on the first layer and a second TSV disposed under the second upper electrode and configured to receive a chip selection code from an external source or an adjacent chip in the stacked plurality of n chips, and a selection signal generator receiving the n-bit chip code and the chip selection code and configured to enable a chip selection signal when an n-bit chip selection signal corresponding to the chip selection code matches the n-bit chip code.

In another aspect, the selection signal generator may comprise a selection code decoder configured to receive and decode a k-bit chip selection code, wherein k is a minimal natural number greater than or equal to $\log_2 n$, and output the n-bit chip selection signal.

In another aspect, the selection signal generator may receive an n-bit chip selection code as the n-bit chip selection signal.

In another aspect, each chip in the stacked plurality of n chips may use one identification code applied through the j first upper electrodes as a corresponding chip identification code.

In another aspect, each chip in the stacked plurality of n chips may use one identification code applied through the j lower electrodes a corresponding identification code.

In another aspect, each chip in the stacked plurality of n chips may comprise a plurality of second layers.

In another aspect, the stacked semiconductor device may further comprise an interface chip configured to communicate various data between the stacked plurality of n chips and the PCB.

In another embodiment, the inventive concept provides a stacked semiconductor device comprising a stacked plurality of 2 m chips. Each chip comprises; m upper electrodes disposed in a first layer, m lower electrodes respectively disposed in a second layer formed on the first layer corresponding to the upper electrodes, m TSVs respectively disposed under the m lower electrodes, and an identification code generator including a single inverter. The m upper electrodes are configured to rotate by a unit of one bit a received identification code and pass the rotated identification code to the corresponding m lower electrodes, and one of the m upper electrodes is connected to a corresponding one of the m lower electrodes by the single inverter.

In one related aspect, each chip in the stacked plurality of 2 m chips may further comprise at least one option inverter, wherein the option inverter of a (2p*m+1)-th chip, where p is a natural number, is enabled to invert one bit of the rotated identification code and transmit a resulting current identification code, and the option inverters of other chips in the stacked plurality of 2 m chips are disabled to transmit the rotated identification code without inverting one bit.

BRIEF DESCRIPTION OF THE DRAWINGS

The foregoing and other features and advantages of the inventive concept will be apparent from the more particular description of certain embodiments, as illustrated in the accompanying drawings. In the drawings.

DETAILED DESCRIPTION OF EMBODIMENTS

Figure 1:
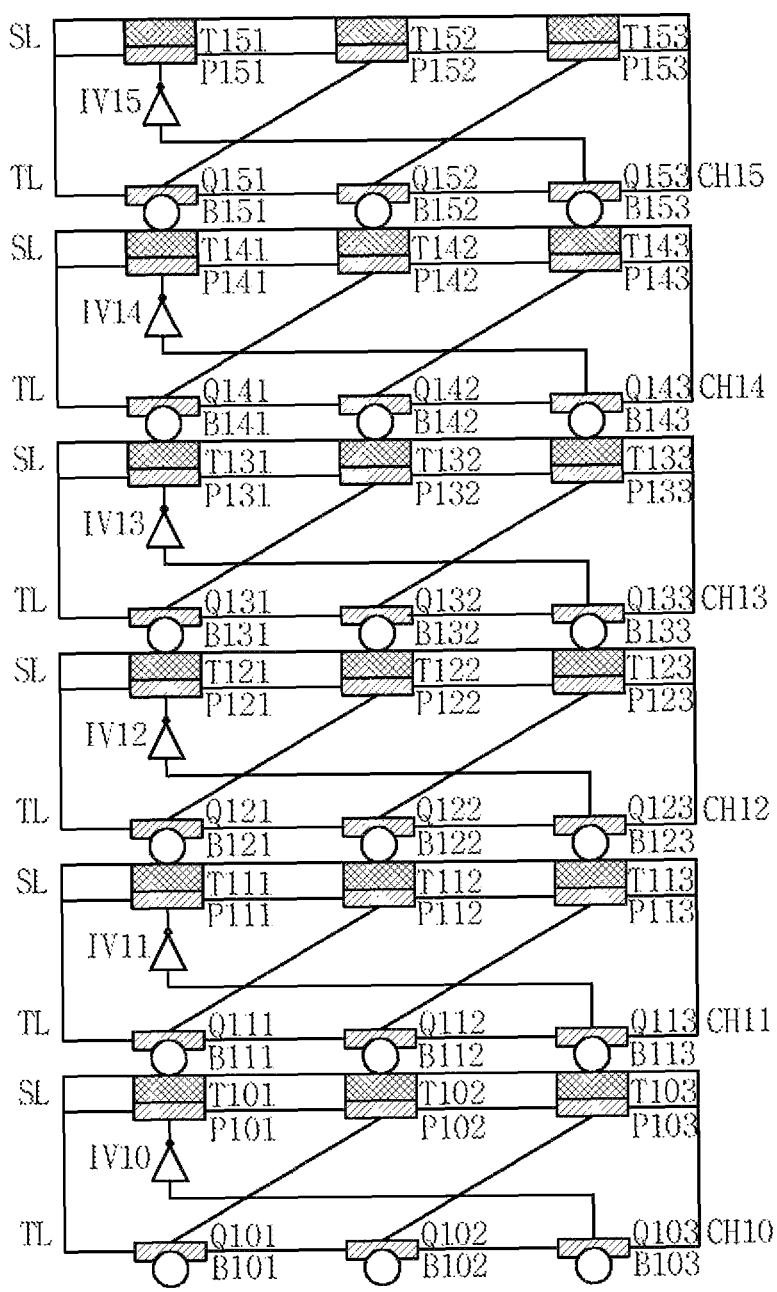
FIG. 1 is a cross-sectional view of a stacked semiconductor device according to an embodiment of the inventive concept.

Various embodiments will now be described more fully with reference to the accompanying drawings. The inventive concepts may, however, be embodied in different forms and should not be construed as being limited to only the illustrated embodiments. Rather, these embodiments are provided so that this disclosure is thorough and complete and fully conveys the inventive concept to those skilled in the art. In the drawings, the size and relative size of various regions, layers, features and components may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Throughout the written description and drawings, like reference numbers and labels are used to denote like or similar elements. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "vertical", "horizontal", "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Within a stacked semiconductor device, each chip in the constituent plurality of stacked chips should have different identification designation (or code), so that each respective chip may be effectively selected from its peers. When the stacked chips have the different identification codes, an external apparatus may select one chip from the stacked plurality of chips using a chip selection signal, a chip selection code, and/or a chip selection address corresponding to the identification code. That is, when the identification code of a specific chip matches a designation (or selection) provided by a chip selection signal, chip selection code, and/or the chip selection address provided by the external apparatus, the corresponding chip may be selected. However, it is often inefficient to merely design a plurality of stacked chips such that each respective chip has a different identification code. For example, problems remain with respect to efficiently communicating a chip selection signal, chip selection code, and/or chip selection address to a particular chip.

Stacked semiconductor devices according to certain embodiments of the inventive concept may be designed with a reduced number of TSVs, and yet individual chips may have a similar configuration while facilitating the selection of any given chip from the plurality of chips having different identification codes.

(FIG.) 1 is a cross-sectional view of a stacked semiconductor device according to an embodiment of the inventive concept. Six (6) chips (respectively designated CH10, CH11, CH12, CH13, CH14 and CH15 and assumed to have different identification codes) are shown in the illustrated stacked semiconductor device, but those skilled in the art will recognize that this number of chips is merely exemplary.

Referring to FIG. 1, each of the chips CH10 to CH15 includes a plurality of layers TL (an upper layer) and SL (a lower layer). (Note; that the respective chips have been flipped during assembly). Although the layers TL and SL are simply illustrated by one line in the cross-sectional view of FIG. 1, each of the layers TL and SL may include one or more particular region(s) in which circuitry is formed. In other words, various devices, regions, components and related connection lines may be formed in each of the layers TL and SL.

The upper layer TL is formed on one surface of each of the chips CH10 to CH15. A plurality of upper electrodes (Q101, Q102, Q103) to (Q151, Q152, Q153) disposed on the upper layer TL are electrically connected to an adjacent chip or an external printed circuit board (PCB) (not shown) by bumps (B101, B102, B103) to (B151, B152, B153). In this context, the term "adjacent chip" identifies a neighboring (above or below) chip relative to another chip in the stacked plurality of chips. The lower layer SL is formed under the upper layer TL and includes a plurality of lower electrodes (P101, P102, P103) to (P151, P152, P153). The upper electrodes (Q101, Q102, Q103) to (Q151, Q152, Q153) may be electrically connected to the lower electrodes (P101, P102, P103) to (P151, P152, P153) by connection lines, such as metal lines, and receive/transmit various signals from/to each other. Also, the lower electrodes (P101, P102, P103) to (P151, P152, P153) may be electrically connected to an adjacent chip or an external PCB (not shown) by TSVs (T101, T102, T103) to (T151, T152, T153) and the bumps (B101, B102, B103) to (B151, B152, B153).

In the respective chips CH10 to CH15 of FIG. 1, the TSVs (T101, T102, T103) to (T151, T152, T153) are connected to the lower electrodes (P101, P102, P103) to (P151, P152, P153) and thus to the adjacent chip by the bumps B111 to B153. Since FIG. 1 illustrates only the identification code generator, it is illustrated that the TSVs (T101, T102, T103) to (T151, T152, T153) are in contact with only the lower electrodes (P101, P102, P103) to (P151, P152, P153). However, the upper electrodes (Q101, Q102, Q103) to (Q151, Q152, Q153) may also be electrically connected to the adjacent chip by the TSVs (T101, T102, T103) to (T151, T152, T153) and the bumps (B101, B102, B103) to (B151, B152, B153) in circuit portions other than the identification code generator.

In general, in a semiconductor chip manufacturing process, the TSVs (T101, T102, T103) to (T151, T152, T153) connected to the lower electrodes (P101, P102, P103) to (P151, P152, P153) are formed using a via-middle process of forming the TSVs first and then the lower layer SL, while the TSVs connected to the upper electrodes (Q101, Q102, Q103) to (Q151, Q152, Q153) are formed using a via-last process of forming the lower layer SL first and then the TSVs.

FIG. 1 illustrates an example of a face-down (or flipped) stacked semiconductor device in which the upper layer TL of each chip ends up stacked in a face-down manner within the resulting stacked semiconductor device. In the face-down stacked semiconductor device of FIG. 1, the upper electrodes (Q101, Q102, Q103) to (Q151, Q152, Q153) disposed on the lowest chip CH10 may be electrically connected to the PCB through the bumps (B101, B102, B103) to (B151, B152, B153), and the upper electrodes (Q111, Q112, Q113) to (Q151, Q152, Q153) of the remaining chips CH11 to CH15 may be electrically connected to the TSVs T101 to T153 of the chips CH10 to CH14 disposed underneath the upper electrodes (Q111, Q112, Q113) to (Q151, Q152, Q153) of the remaining chips CH11 to CH15 by the bumps (B111, B112, B113) to (B151, B152, B153), respectively.

In FIG. 1, each of the six chips CH10 to CH15 includes the TSVs corresponding to the half of the number of the stacked chips, that is, the three TSVs (T101, T102, T103) to (T151, T152, T153), respectively, to generate the identification code. The TSVs (T101, T102, T103) to (T151, T152, T153) are connected to the respective lower electrodes (P101, P102, P103) to (P151, P152, P153) corresponding to the lower layer SL. Further, each of the six chips includes one of the inverters IV10 to IV15 formed on the upper layer TL or the lower layer SL.

In the respective chips CH10 to CH15, the plurality of upper electrodes (Q101, Q102, Q103) to (Q151, Q152, Q153) are configured to be matched with the plurality of lower electrodes (P101, P102, P103) to (P151, P152, P153) on a one-to-one basis. Among the upper electrodes (Q101, Q102, Q103) to (Q151, Q152, Q153), the upper electrodes Q103, Q113, Q123, Q133, Q143, and Q153 disposed on one side of the respective chips are electrically connected to lower electrodes P101, P111, P121, P131, P141, and P151 disposed on at the other side of the respective chips by the connection lines. The remaining upper electrodes (Q101, Q102) to (Q151, Q152) are electrically connected to the adjacent lower electrodes (P102, P103) to (P152, P153) of the corresponding lower electrodes (P101, P102) to (P151, P152) by the connection lines. That is, the upper electrodes (Q101, Q102, Q103) to (Q151, Q152, Q153) are configured to be rotated in unit of one electrode, and be connected to the lower electrodes (P101, P102, P103) to (P151, P152, P153). Since the upper and lower electrodes (Q101, Q102, Q103) to (Q151, Q152, Q153) and (P101, P102, P103) to (P151, P152, P153) correspond to bits of the respective identification codes, so that the identification codes applied to the upper electrodes (Q101, Q102, Q103) to (Q151, Q152, Q153) are rotated in unit of 1 bit, and are applied to the lower electrodes (P101, P102, P103) to (P151, P152, P153).

The inverters IV10 to IV15 invert signals applied from ones Q103, Q123, Q133, Q143, and Q153 of the upper electrodes (Q101, Q102, Q103) to (Q151, Q152, Q153), and apply the inverted signals to the lower electrodes P101, P111, P121, P131, P141, and P151, respectively. Thus, the plurality of chips CH10 to CH15 invert one of the bits of the identification codes applied from an adjacent chip or PCB to the upper electrodes (Q101, Q102, Q103) to (Q151, Q152, Q153), rotate the inverted identification codes in unit of 1 bit, and apply the rotated identification codes to the lower electrodes (P101, P102, P103) to (P151, P152, P153), respectively.

In this case, the bits inverted by the inverters IV10 to IV15 in the respective stacked chips CH10 to CH15 have the same position. In other words, the inverters IV10 to IV15 are disposed at the same position in the respective chips CH10 to CH15. Thus, the plurality of chips CH10 to CH15 may be designed to have the same general layout configuration. Although it is illustrated in FIG. 1 that the identification codes applied to the upper electrodes Q103, Q113, Q123, Q133, Q143, and Q153 on one side of the respective chips are inverted and applied to the lower electrodes P101, P111, P121, P131, P141, and P151 on the other side of the respective chips, the inventive concept is not limited thereto. For example, the positions of the inverters IV10 to IV15 may be controlled when the bits disposed at the same position are inverted and applied in the plurality of chips CH10 to CH15. In other words, the identification codes applied to the upper electrodes Q101, Q111, Q121, Q131, Q141, and Q151 may be inverted and applied to the lower electrodes P102, P112, P122, P132, P142, and P152.

TABLE 1

| Chip | Identification Code | | |
|------|---|---|---|
| CH15 | 1 | 1 | 0 |
| CH14 | 1 | 0 | 0 |
| CH13 | 0 | 0 | 0 |
| CH12 | 0 | 0 | 1 |
| CH11 | 0 | 1 | 1 |
| CH10 | 1 | 1 | 1 |

Table 1 shows identification codes for the stacked chips CH10 to CH15 when high-level identification codes are applied from the PCB to the lowest bumps B101 to B103, respectively. Each of the chips CH10 to CH15 may use a signal applied to the upper layer TL or a signal applied to the lower layer SL as an identification code. In Table 1, it is assumed that each of the chips CH10 to CH15 uses the signal applied to the upper layer TL as the identification code.

As shown in Table 1, although the plurality of chips CH10 to CH15 of the stacked semiconductor device of FIG. 1 have identification code generators with the same configuration, the plurality of chips CH10 to CH15 may generate different identification codes, respectively. Further, although only the TSVs (T101, T102, T103) to (T151, T152, T153) corresponding to the half of the stacked chips CH10 to CH15 are provided, the plurality of chips CH10 to CH15 may generate different identification codes, respectively.

Thus, when the stacked chips CH10 to CH15 perform the same function, the chips CH10 to CH15 may be designed to have the same configuration. For instance, if the stacked chips CH10 to CH15 are a plurality of stacked memory chips that are designed to have the same configuration, the memory chips may have different identification codes, so that they can be distinguished from one another. Also, although the stacked chips CH10 to CH15 are differently designated chips, the chips CH10 to CH15 may nonetheless be fabricated with the same general layout configuration, so that it is easy and relatively cheap to design the stacked semiconductor device.

TABLE 2

| Chip | Identification Code | | |
|------|---|---|---|
| CH15 | 0 | 1 | 1 |
| CH14 | 1 | 1 | 1 |
| CH13 | 1 | 1 | 0 |
| CH12 | 1 | 0 | 0 |
| CH11 | 0 | 0 | 0 |
| CH10 | 0 | 0 | 1 |

Table 2 shows that, although the identification codes having different levels are applied from the PCB to the lowest bumps B101 to B103, the stacked chips have different identification codes. In Table 2, it is assumed that a identification code "011" is applied to the lowest bumps B101 to B103, and that each chip uses the signal applied to the lower layer SL as the identification code. That is, as shown in Table 2, all identification codes applied from the PCB to the lowest bumps B101 to B103 may not have the same level. The identification code applied to the lower layer SL, rather than the identification code applied to the upper layer TL, may be used as the identification code of each chip.

Although FIG. 1 illustrates only one lower layer SL, each of the chips CH10 to CH15 may include a plurality of lower layers SL. When each of the chips CH10 to CH15 includes a plurality of lower layers SL, the plurality of lower layers SL may be electrically connected to one another or to the upper layer TL by connection lines.

Although FIG. 1 illustrates a face-down stacked semiconductor device, the inventive concept may also be applied to a face-up stacked semiconductor device in which an upper layer TL of each chip is stacked in a face-up manner.

Figure 2:
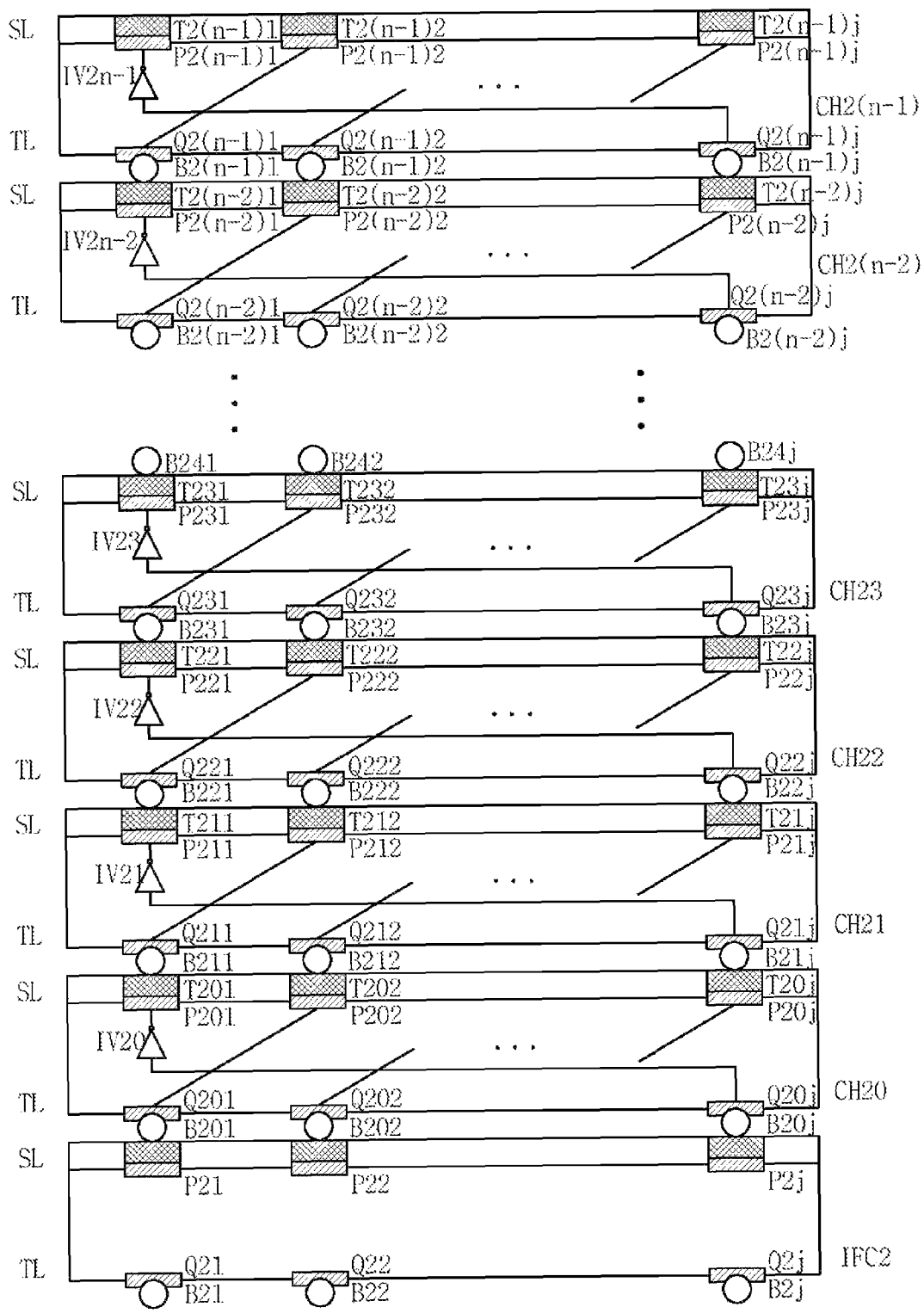
FIG. 2 is a cross-sectional view of a stacked semiconductor device according to another embodiment of the inventive concept.

FIG. 2 is a cross-sectional view of a stacked semiconductor device according to another embodiment of the inventive concept.

While the stacked semiconductor device of FIG. 1 has a structure in which the six (6) chips are stacked, the stacked semiconductor device of FIG. 2 more generally illustrates a structure in which an arbitrary number of chips "n" (e.g., CH20 to CH2(n−1), where n is a natural number). Similar to FIG. 1, FIG. 2 illustrates a face-down stacked semiconductor device in which each chip is shown with only an identification code generator.

Referring to FIG. 2, since the stacked plurality of "n" chips CH20 to CH2(n−1) are provided, the stacked chips CH20 to CH2(n−1) may include "j" TSVs used to generate chip identification codes (e.g., T201 to T20j through (T2(n−1)1 to T2(n−1)j, respectively where "j" is the minimum natural number greater than or equal to n/2). Also, the upper electrodes (Q201 to Q20j) through (Q2(n−1)1 to Q2(n−1)j) of the respective chips CH20 to CH2(n−1) are rotated by a unit of 1 bit and are connected to the TSVs (T201 to T20j) through (T2(n−1)1 to T2(n−1)j) through lower electrodes (P201 to P20j) to (P2(n−1)1 to P2(n−1)j). In this case, selected upper electrode(s) (e.g., Q20j, Q21j, . . . , Q2(n−1)j) of the upper electrodes (Q201 to Q20j) through (Q2(n−1)1 to Q2(n−1)j) may be connected to the lower electrodes P201, P211, . . . , P2(n−1)1 through inverters IV20 to IV2(n−1), respectively.

That is, one bit of the identification code applied to an upper layer TL may be inverted, rotated by a unit of 1 bit, and then applied to a lower layer SL.

FIG. 2 illustrates the stacked semiconductor device, which may further include an interface chip IFC2 in addition to the stacked plurality of "n" chips. The interface chip IFC2 may be used to connect a PCB (not shown) and enable communication of various signals between the plurality of stacked chips CH20 to CH2(n-1) and the PCB. According to circumstances, the interface chip IFC2 may further include an additional controller to control the plurality of stacked chips CH20 to CH2(n-1). For example, when all the stacked chips CH20 to CH2(n-1) are memory chips, it is inefficient for the chips CH20 to CH2(n-1) to have respective controllers. Thus, each of the stacked chips CH20 to CH2(n-1) may include only a memory cell array and related minimal control circuitry, and a common control circuit for the plurality of chips CH20 to CH2(n-1) may be installed in the interface chip IFC2, thereby increasing memory integration density. The common control circuit may include a clock generator and a power supply voltage supplier. Since the interface chip IFC2 may have one of various internal circuit configurations, the internal circuit configuration of the interface chip IFC2 is omitted in FIG. 2.

As illustrated in FIGS. 1 and 2, the stacked semiconductor device according to the certain embodiments of the inventive concept are capable of generating different identification codes assigned to respective chips in the stacked plurality of chips using an arrangement of TSVs corresponding to the one-half the number of stacked chips.

Figure 3:
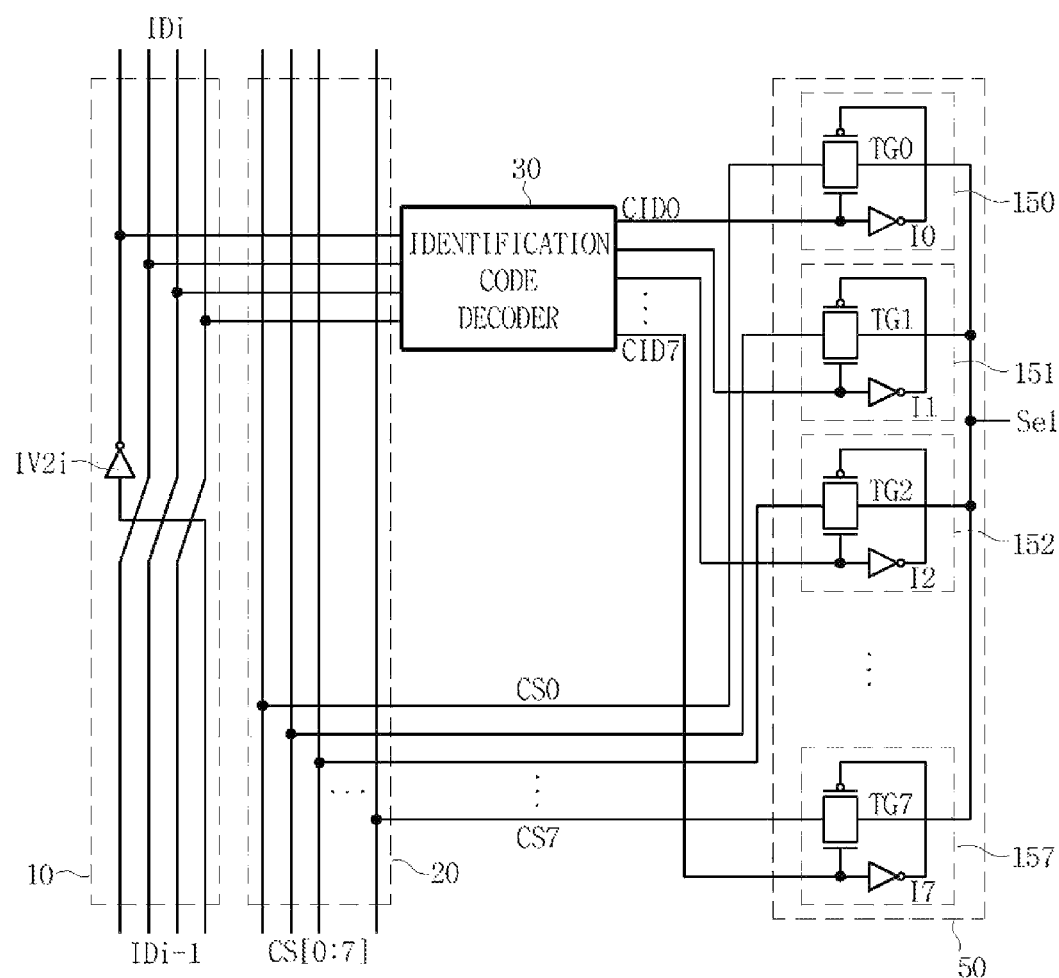
FIG. 3 illustrates one possible example of a connection layout for one chip in the stacked semiconductor device of FIG. 2.

FIG. 3 illustrates one possible example of a connection layout for each one of the chips of the stacked semiconductor device of FIG. 2. For purposes of more particularly describing the example illustrated in FIG. 3, it is further assumed that n=8 for the stacked semiconductor memory device of FIG. 2. Thus, a competent identification code generator 10 may include four (4) TSVs and be configured to generate a 4-bit identification code IDi. That is, the identification code generator 10 may receive a 4-bit identification code IDi-1 through constituent upper electrodes, rotate the 4-bit identification code IDi-1 by a logical unit (or value) of 1 bit, invert one bit of the resulting rotated identification code, and then apply the resulting inverted rotated identification code IDi to constituent lower electrodes. In this manner, the respective chips in the stacked plurality of chips may be effectively distinguished during chip selection functions using an identification code IDi promulgated through the TSV-enabled identification code generator 10.

Each chip within a stacked plurality of chips may be similar configured as shown in FIG. 3 to include a chip-enable signal generator comprising the TSV-enabled identification code generator 10. In the above-described face-down stacked semiconductor device, the identification code generator 10 of each chip receives an identification code IDi-1 (or a "previous" identification code IDi-1) promulgated "up" from either a lower adjacent chip or a lower disposed PCB, rotates the previous identification code IDi-1 by a unit of 1 bit and inverts one bit of the rotated previous identification code to generate a "current" identification code IDi. This current identification code—now associated with the subject chip in the stacked plurality of chips by operation of the identification code generator 10—is now applied to an above adjacent chip disposed above an upper stage of the subject chip. In effect, the current identification code for a lower adjacent chip becomes a corresponding previous identification code for an upper adjacent chip in the stack. Also, since the TSVs are connected to the upper electrodes in a chip selection code transmitter 20 (see FIG. 3), the chip selection code transmitter 20 may receive a chip selection signal CS[0:7] from a lower disposed PCB or a lower adjacent chip, and transmits the chip selection signal CS[0:7] to an upper adjacent chip without necessarily converting the chip selection signal CS[0:7]. In FIG. 3, since the chip selection signal CS[0:7] is applied with a number of bits equal to the number of stacked chips, a 8-bit chip selection signal CS[0:7] is applied.

In FIG. 3, since the TSVs within the chip selection code transmitter 20 should transmit the chip selection signal CS[0:7], the number of TSVs is equal to the number of stacked chips. Also, the chip selection signal CS[0:7] may be use to apply an additional external signal or code, or may be used to apply an address. For example, when the semiconductor device is a memory device, the chip selection signal CS[0:7] may be included in a bank address, a low address, or a column address when applied, or be applied in the type of a chip enable signal or a clock enable signal. Thus, the chip selection signal CS[0:7] may be applied in many different forms to provide different control signal types. In addition, the chip selection signals CS0 to CS7 may be decoded by the PCB or the interface chip IFC2, and applied to the respective chips. More particularly, in the stacked semiconductor device in which the 8 chips are stacked, the chip selection signal CS[0:7] may be applied to the PCB or the interface chip IFC2 through a 3-bit signal line, and be decoded by the PCB or interface chip IFC2 while only one of the bits of the chip selection signal CS[0:7] is simultaneously enabled.

With reference to FIG. 3, an identification code decoder 30 receives the current identification code IDi from the identification code generator 10, decodes the current identification code IDi, and outputs a resulting 8-bit chip code CID0 to CID7 to a selection signal generator 50. The selection signal generator 50, as illustrated in FIG. 3, may include a plurality of selection signal transmitters 150 to 157 that transmit the corresponding chip selection signals CS0 to CS7 as selection signals (SEL).

In each of the chips CHi in a stack of "i" chips, the identification code decoder 30 may enable one of the chip codes CID0 to CID7, and simultaneously only one of the chip selection signals CS0 to CS7 may be enabled and applied. When the enabled one of the chip codes CID0 to CID7 matches the enabled one of the chip selection signals CS0 to CS7, the selection signal SEL is enabled. When the selection signal SEL is enabled, the corresponding chip is enabled.

The selection signal transmitters 150 to 157 include transmission gates TG0 to TG7 and inverters 10 to 17, respectively. The inverters 10 to 17 invert the corresponding chip codes CID0 to CI7 and apply the inverted chip codes to gates of PMOS transistors of the corresponding transmission gates TG0 to TG7. The chip codes CID0 to CID7 are applied to gates of NMOS transistors of the transmission gates TG0 to TG7. Thus, the transmission gates TG0 to TG7 transmit the corresponding chip selection signals CS0 to CS7 when the corresponding chip codes CID0 to CID7 are enabled. Although not shown, the plurality of selection signal transmitters 150 to 157 may further include buffers, which receive the corresponding chip selection signals CS0 to CS7, buffer the received chip selection signals CS0 to CS7, and apply the buffered signals to the transmission gates TG0 to TG7, respectively.

Additionally and referring to FIG. 3, since only an output signal of one of the plurality of transmission gates TG0 to TG7 is enabled, the selection signals SEL serve to simply connect output signals of the plurality of transmission gates TG0 to TG7. However, the selection signal generator 50 may further include an OR gate configured to receive output signals of the plurality of transmission gates TG0 to TG7 to output the selection signals SEL(s). Further, the selection signal generator 50 may further include another logic gate configured to generate the selection signals SEL according to enabling levels of the chip codes CID0 to CI7.

Figure 4:
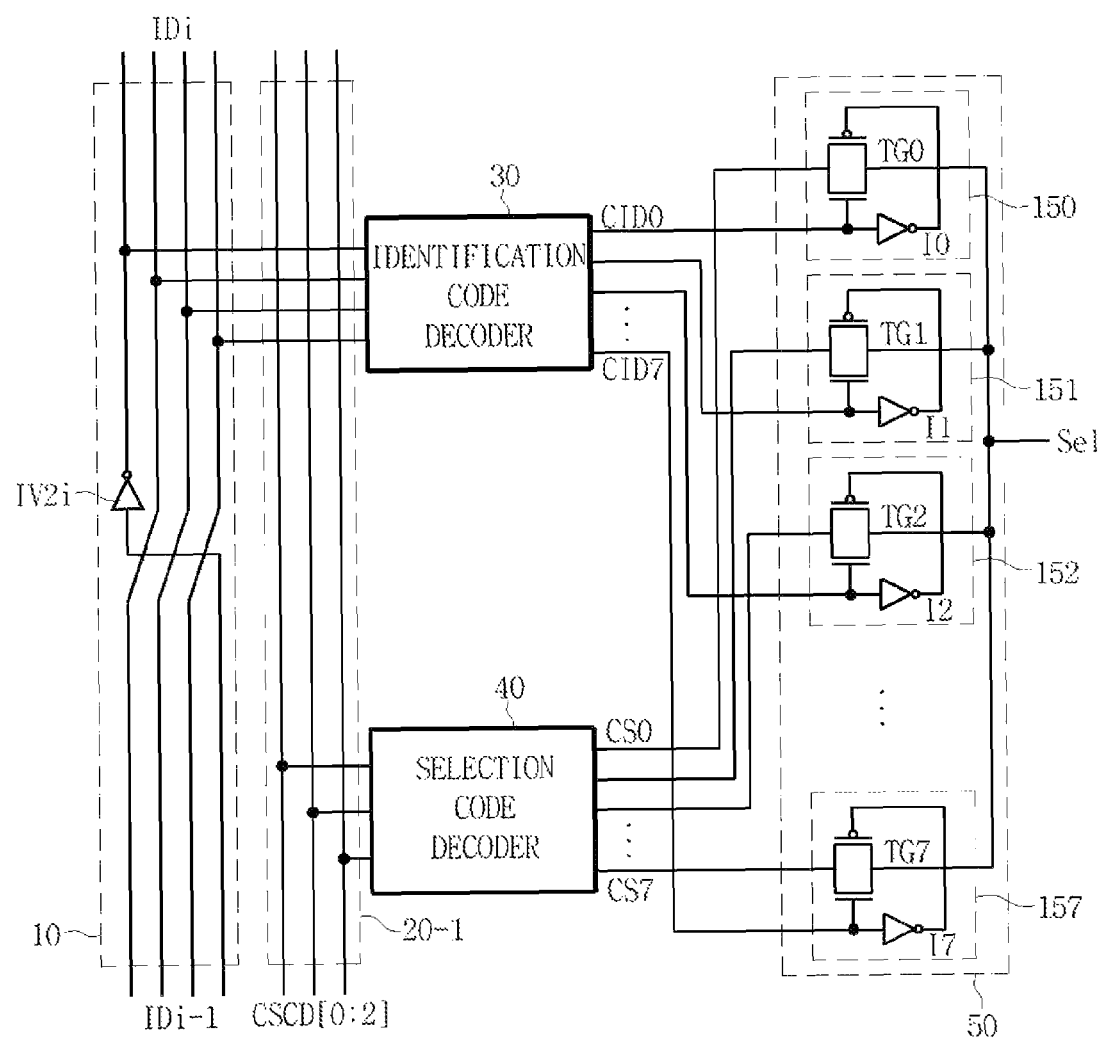
FIG. 4 illustrates another possible example of a connection layout for one chip of the stacked semiconductor device of FIG. 2.

FIG. 4 illustrates another possible example of chips within the stacked semiconductor device of FIG. 2. In FIG. 4, it is also assumed that the number of stacked chips is 8 as in FIG. 3. However, unlike the chip selection code transmitter 20 of FIG. 3, a chip selection code transmitter 20-1 of FIG. 4 is configured to have "k" TSVs when the number of chips is 2 k, and therefore comprises has three (3) TSVs. In other words, the number of TSVs for the chip selection signals CS0 to CS7 may be reduced. Also, the chip selection code transmitter 20-1 of each of the chips CHi receives a chip selection code CSCD[0:2] and transmits the chip selection code CSCD[0:2] to an adjacent chip CHi+1. As the number of TSVs of the chip selection code transmitter 20-1 is reduced, the chip selection code CSCD[0:2] is applied with the number of bits smaller than that of the chip selection signal CS[0:7]. Each of the plurality of chips CHi includes a selection signal decoder 40, which decodes the chip selection code CSCD[0:2] to generate chip selection signals CS0 to CS7. Therefore, the chip of FIG. 4 includes the selection code decoder 40 to enable the chip selection signals CS0 to CS7 instead of reducing the number of TSVs of the chip selection code transmitter 20-1.

With reference to FIG. 4, since the identification code generator 10, the identification code decoder 30, and the selection signal generator 50 have the same configuration as in FIG. 3, a description thereof will be omitted.

However, each of the selection signal transmitters 150 to 157 of FIGS. 3 and 4 may be embodied by an AND gate instead of the transmission gates TG0 to TG7 and the inverters 10 to 17. That is, the AND gate may perform a logical product of the chip codes CID0 to CID7 and the chip selection signals CS0 to CS7 corresponding to the chip codes CID0 to CID7 and enable the corresponding selection signals Sel. Further, each of the selection signal transmitters 150 to 157 of FIGS. 3 and 4 may have another configuration according to enabling levels of the chip codes CID0 to CID7 and the chip selection signals CS0 to CS7.

Figure 5:
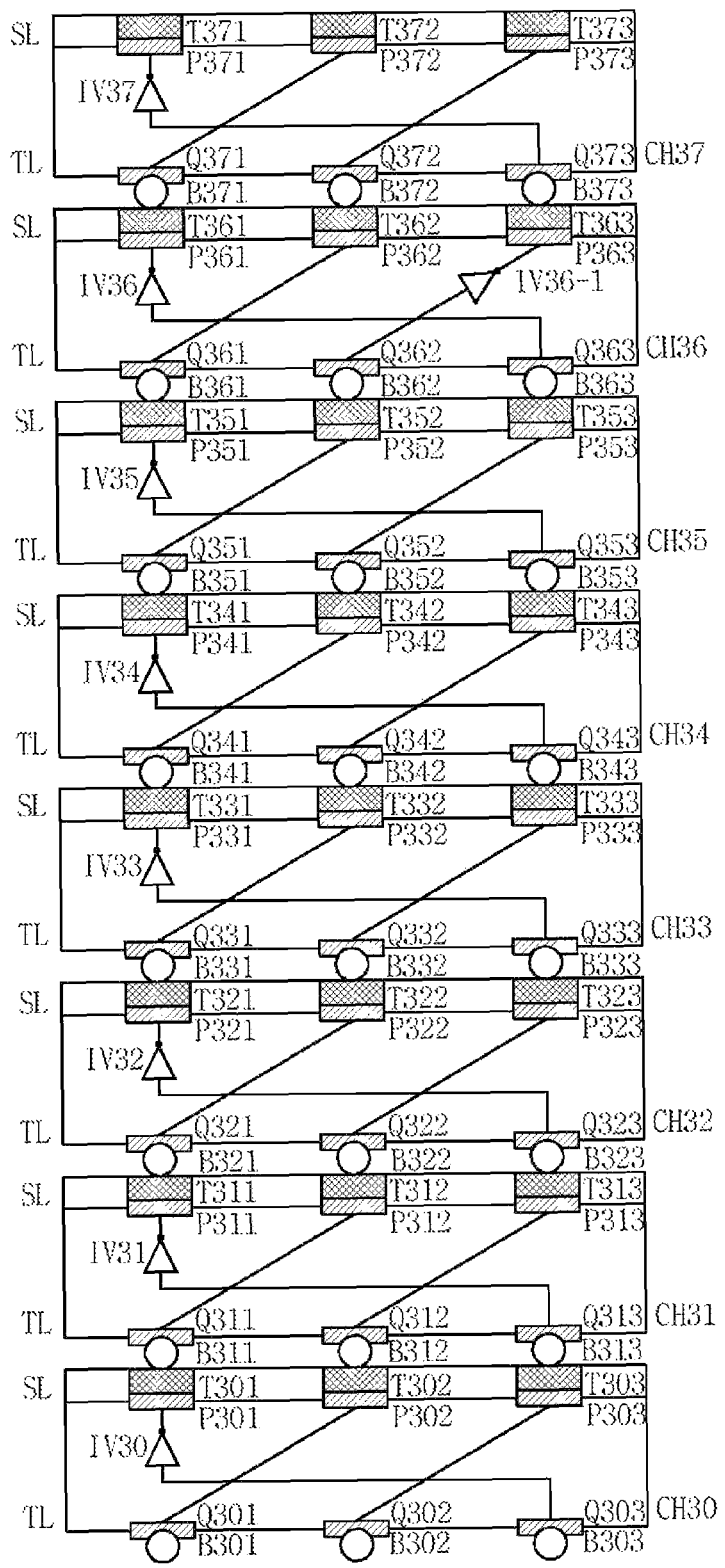
FIG. 5 is a diagram of a stacked semiconductor device according to yet another embodiment of the inventive concept.

FIG. 5 illustrates a stacked semiconductor device according to yet another embodiment of the inventive concept.

In FIGS. 1 through 4, the identification code generator 10 of each of the chips includes the TSVs corresponding to the half of the stacked chips. However, in the semiconductor device of FIG. 5, when "n" chips are stacked, an identification code generator may include $\log_{2n}$ TSVs to generate a corresponding identification code. Since FIG. 5 illustrates the stacked semiconductor device assuming which eight (8) chips, the identification code generator 10 would therefore include three (3) TSVs.

Similar to FIGS. 1 and 2, the identification codes applied to the upper electrodes (Q301, Q302, Q303) to (Q371, Q372, Q373) of the respective chips are rotated in unit of one electrode, are inverted in unit of 1 bit by inverters IV30 to IV37, and are connected to lower electrodes (P301, P302, P303) to (P371, P372, P373) of the corresponding chips. However, in the semiconductor device of FIG. 5, when the identification codes applied to upper (Q301, Q302, Q303) to (Q371, Q372, Q373) are simply inverted in unit of 1 bit, are rotated, and are applied to lower electrodes (P301, P302, P303) to (P371, P372, P373) as in FIGS. 1 and 2, the identification codes are superposed in the chips. To prevent this superposition, the semiconductor device of FIG. 5 further includes an option inverter IV36-1.

TABLE 3

| Chip | Identification Code | | |
|------|---|---|---|
| CH37 | 0 | 1 | 0 |
| CH36 | 0 | 1 | 1 |
| CH35 | 1 | 1 | 0 |
| CH34 | 1 | 0 | 0 |
| CH33 | 0 | 0 | 0 |
| CH32 | 0 | 0 | 1 |
| CH31 | 0 | 1 | 1 |
| CH30 | 1 | 1 | 1 |

Table 3 shows the identification codes for the stacked chips CH30 to CH37 when high-level identification codes are applied from the PCB to the lowest bumps B301 to B303. Also, it is assumed that each of the chips CH30 to CH37 uses a signal applied to the upper layer TL as the identification code.

As shown in Table 3, the semiconductor device in which the eight chips CH30 to CH37 are stacked may generate the identification codes, which are different from one another, using only three TSVs. However, for simple design, the identification code generators of the eight stacked chips CH30 to CH37 may be typically designed to have the same configuration. Thus, although it is illustrated in FIG. 5 that only the seventh chip CH36 includes the option inverter IV36-1, all the chips CH30 to CH37 may include the respective option inverters, among which the unused ones may be disabled using a fuse process, a laser process, and a process of forming additional TSVs.

In FIG. 5, since the semiconductor device including the eight chips CH30 to CH37 is described by way of an example, only one option inverter IV36-1 is further enabled. However, when the number of stacked chips is increased, the number of enabled option inverters may also be increased. If necessary, at least two option inverters may be further enabled in one chip.

When the number of stacked chips is $2^m$, the option inverter of the $(2p*m+1)$-th chip may be enabled (where p is a natural number). That is, although it is illustrated in FIG. 5 that the option inverter IV36-1 of the seventh chip is enabled, when 16 chips are stacked, the option inverter of the ninth chip (when $16=2^4$, $2*4+1=9$) may be enabled.

Consequently, the stacked semiconductor device of FIG. 5 requires an additional process for enabling the option inverter, but it can minimize the number of TSVs configured to generate the identification codes.

In the present inventive concept, the stacked semiconductor devices of FIGS. 1 and 2 may have the same configuration as the stacked semiconductor device of FIG. 5 when the number of stacked chips is 4 or less.

Although it is illustrated for clarity that the length of the TSVs is less than the distance between the upper layer and the lower layer, the distance between the upper and lower layers and the length of the TSVs may be variously embodied.

Therefore, in the stacked semiconductor device according to embodiments, although a plurality of chips are designed to have the same configuration, the number of TSVs may be reduced and the plurality of chips may have the identification codes different from one another. Thus, the stacked semiconductor device may select each of the stacked chips.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A stacked semiconductor device comprising a stacked plurality of n chips,
wherein each chip comprises:
j first upper electrodes disposed in a first layer, wherein j is a minimal natural number greater than or equal to n/2;
j lower electrodes disposed in a second layer on the first layer and being respectively associated with the j first upper electrodes;
j first TSVs being respectively connected between the j lower electrodes and an upper adjacent chip in the stacked plurality of n chips; and
an identification code generator including a single inverter connecting one of the j first upper electrodes to a corresponding one of the j lower electrodes,
the j first upper electrodes are configured to receive a previous identification code from a lower adjacent chip in the stacked plurality of n chips, rotate the previous identification code by a unit of 1 bit, and invert 1 bit of the rotated previous identification code to generate a current identification code, and
the current identification code is applied through the j lower electrodes and j first TSVs to communicate the current identification code to the upper adjacent chip,
wherein each chip further comprises:
an identification code decoder configured to receive the current identification code from the identification code generator and decode the current identification code to generate an n-bit chip code;
a chip selection code transmitter comprising a second upper electrode disposed on the first layer and a second TSV disposed under the second upper electrode and configured to receive a chip selection code from an external source or an adjacent chip in the stacked plurality of n chips; and
a selection signal generator receiving the n-bit chip code and the chip selection code and configured to enable a chip selection signal when an n-bit chip selection signal corresponding to the chip selection code matches the n-bit chip code.

2. The device of claim 1, further comprising a printed circuit board (PCB) disposed below a lowest chip in the stacked plurality of n chips and configured to receive an externally provided j-bit identification code, wherein the j-bit identification code is the previous identification code received by the lowest chip.

3. The device of claim 2, wherein the selection signal generator comprises a selection code decoder configured to receive and decode a k-bit chip selection code, wherein k is a minimal natural number greater than or equal to $\log_2 n$, and output the n-bit chip selection signal.

4. The device of claim 2, wherein the selection signal generator receives an n-bit chip selection code as the n-bit chip selection signal.

5. The device of claim 2, wherein each chip in the stacked plurality of n chips uses one identification code applied through the j first upper electrodes as a corresponding chip identification code.

6. The device of claim 2, wherein each chip in the stacked plurality of n chips uses one identification code applied through the j lower electrodes a corresponding identification code.

7. The device of claim 1, wherein each chip in the stacked plurality of n chips comprises a plurality of second layers.

8. The device of claim 2, further comprising an interface chip configured to communicate various data between the stacked plurality of n chips and the PCB.

9. A stacked semiconductor device comprising a stacked plurality of 2 m chips,
wherein each chip comprises:
m upper electrodes disposed in a first layer;
m lower electrodes respectively disposed in a second layer formed on the first layer corresponding to the upper electrodes;
m TSVs respectively disposed under the m lower electrodes; and
an identification code generator including a single inverter,
wherein the m upper electrodes are configured to rotate by a unit of one bit a received identification code and pass the rotated identification code to the corresponding m lower electrodes, and
one of the m upper electrodes is connected to a corresponding one of the m lower electrodes by the single inverter,
wherein each chip in the stacked plurality of 2 m chips comprises at least one option inverter.

10. The device of claim 9, wherein the option inverter of a (2p*m+1)-th chip, where p is a natural number, is enabled to invert one bit of the rotated identification code and transmit a resulting current identification code, and
the option inverters of other chips in the stacked plurality of 2 m chips are disabled to transmit the rotated identification code without inverting one bit.

11. The device of claim 10, further comprising a printed circuit board (PCB) disposed below a lowest chip in the stacked plurality of 2 m chips and configured to receive an externally provided m-bit identification code, wherein the m-bit identification code is the previous identification code received by the lowest chip.

12. The device of claim 9, wherein each chip further comprises:
an identification code decoder configured to receive the current identification code from the identification code generator and decode the current identification code to generate an m-bit chip code;
a chip selection code transmitter comprising a second upper electrode disposed on the first layer and a second TSV disposed under the second upper electrode and configured to receive a chip selection code from an external source or an adjacent chip in the stacked plurality of 2 m chips; and
a selection signal generator receiving the 2 m-bit chip code and the chip selection code and configured to enable a chip selection signal when an 2 m-bit chip selection signal corresponding to the chip selection code matches the m-bit chip code.

13. The device of claim 12, wherein the selection signal generator further comprises a selection code decoder configured to receive and decode the m-bit chip selection code and output the 2 m-bit chip selection signal.

14. The device of claim 12, wherein the selection signal generator receives the 2 m-bit chip selection code as a 2 m-bit chip selection signal.

15. The device of claim 9, wherein the 2 m chips use identification codes applied to the m first upper electrodes as chip identification codes, respectively.

16. The device of claim 9, wherein the 2 m chips use identification codes applied to the m lower electrodes as identification codes of the corresponding chips, respectively.

17. The device of claim 9, wherein each of the 2 m chips comprises a plurality of second layers.

18. The device of claim 9, further comprising an interface chip configured to communicate data between the stacked chips and the PCB.

* * * * *